(12) United States Patent
Ashok Kumar et al.

(10) Patent No.: US 11,099,232 B2
(45) Date of Patent: Aug. 24, 2021

(54) ON-DIE RELIABILITY MONITOR FOR INTEGRATED CIRCUIT

(71) Applicant: Intel Corporation, Santa Clara, CA (US)

(72) Inventors: Suriya Ashok Kumar, Portland, OR (US); Ketul B. Sutaria, Hillsboro, OR (US); Stephen M. Ramey, North Plains, OR (US)

(73) Assignee: Intel Corporation, Santa Clara, CA (US)

(*) Notice: Subject to any disclaimer, the term of this patent is extended or adjusted under 35 U.S.C. 154(b) by 173 days.

(21) Appl. No.: 16/265,661

(22) Filed: Feb. 1, 2019

(65) Prior Publication Data
US 2020/0249271 A1 Aug. 6, 2020

(51) Int. Cl.
*G01R 31/28* (2006.01)
*H03K 3/03* (2006.01)
*G01R 31/00* (2006.01)

(52) U.S. Cl.
CPC ....... *G01R 31/2884* (2013.01); *G01R 31/006* (2013.01); *G01R 31/2856* (2013.01); *G01R 31/2858* (2013.01); *H03K 3/0315* (2013.01)

(58) Field of Classification Search
CPC .............. H03K 3/0315; G01R 31/2856; G01R 31/2855; G01R 31/2858; G01R 31/2621; G01R 31/2642; G01R 31/2817; G01R 31/2851
See application file for complete search history.

(56) References Cited

U.S. PATENT DOCUMENTS 7,592,876 B2 * 9/2009 Newman ............ G01R 31/2856
324/762.09
7,642,864 B2 * 1/2010 Chuang ................ H03K 3/0315
331/44

* cited by examiner

*Primary Examiner* — Ryan Johnson
(74) *Attorney, Agent, or Firm* — Schwabe, Williamson & Wyatt, P.C.

(57) ABSTRACT

Various embodiments provide a health monitor circuit including an n-type sensor to determine a first health indicator associated with n-type transistors of a circuit block and a p-type sensor to determine a second health indicator associated with p-type transistors of the circuit block. The n-type sensor and p-type sensor may be on a same die as the circuit block. The health monitor circuit may further include a control circuit to adjust one or more operating parameters, such as operating voltage and/or operating frequency, for the circuit block based on the first and second health indicators. Other embodiments may be described and claimed.

22 Claims, 7 Drawing Sheets

ON-DIE RELIABILITY MONITOR FOR INTEGRATED CIRCUIT

FIELD

Embodiments of the present invention relate generally to the technical field of electronic circuits, and more particularly to an on-die reliability monitor for an integrated circuit.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In integrated circuits, two main aging mechanisms that degrade circuit devices (e.g., transistors) are bias temperature instability (BTI) and hot carrier injection (HCI). Device aging has escalated as technology scales and the dominant aging influence shifts from BTI to HCI. Although aging at device level is well characterized, modulation in degradation due to ambient circuit stress conditions is not well understood. This gap can be exacerbated in circuits employing feedbacks to regulate certain figures of merit conditions, which can significantly reduce lifetime of a product. The traditional method to manage product reliability is to estimate the product degradation using silicon reliability data/models and extrapolate it to product field failure rate. Products and technology are then designed with enough reliability margin to last for 5-7 years of product lifetime.

Automotive products (and, especially, autonomous/self-driving vehicles) have much more stringent reliability specifications which require device to last for 10-15 years or more. These requirements are set by respective governments. For example, to be compliant with Grade 0 AECQ100 standard for automotive products, together with an accurate failure rate control down to 1 part per million (ppm), it is needed to jointly use Process, Temperature and Aging compensation schemes. In parallel, the new version of ISO26262 norm requires a constant, runtime safety monitoring.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
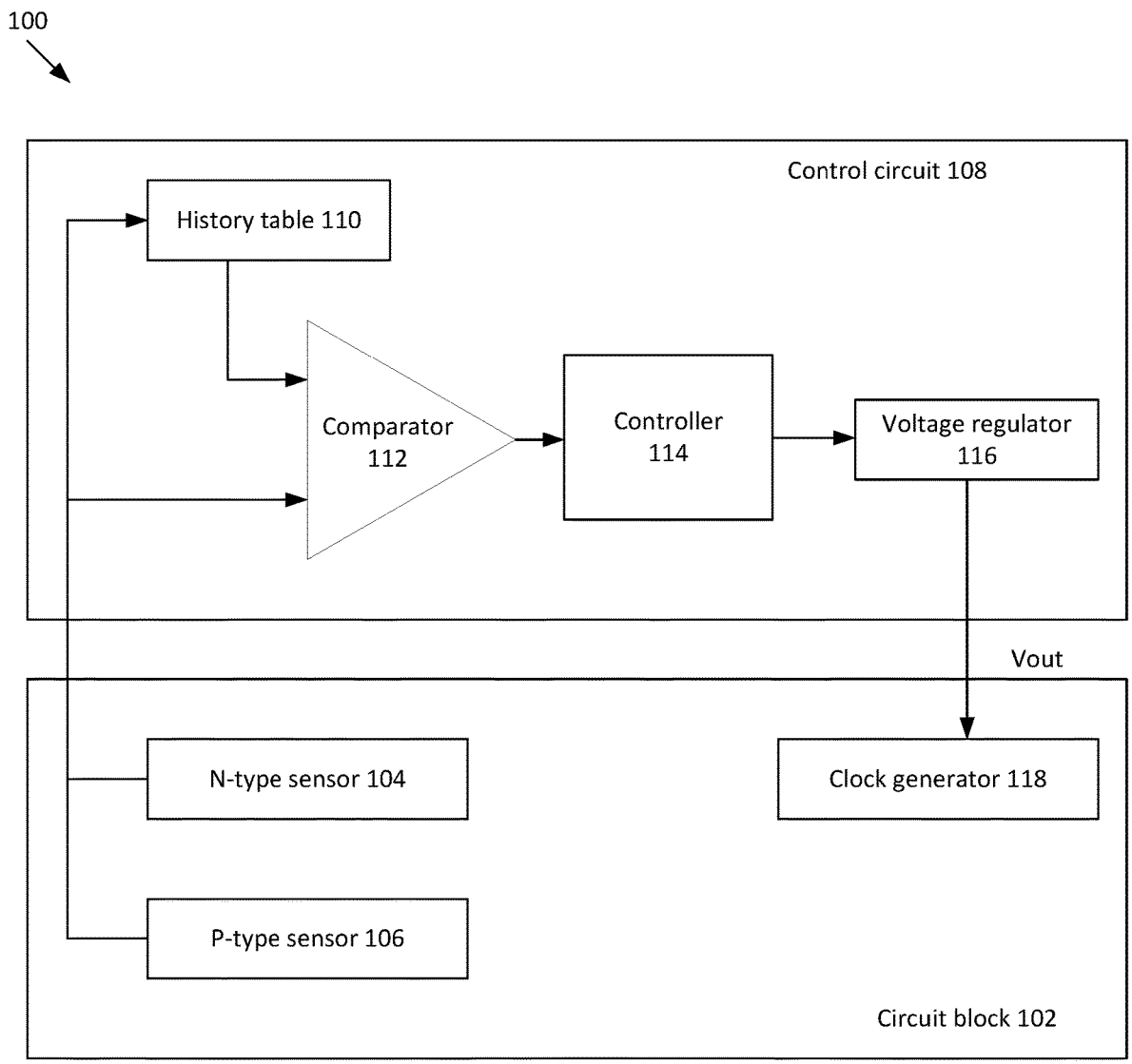
FIG. 1 illustrates a health monitor circuit including an n-type sensor and a p-type sensor, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments provide a health monitor circuit including an n-type sensor to determine a first health indicator associated with n-type transistors of a circuit block and a p-type sensor to determine a second health indicator associated with p-type transistors of the circuit block. The n-type sensor and p-type sensor may be on a same die as the circuit block. The health monitor circuit may further include a control circuit to adjust one or more operating parameters, such as operating voltage and/or operating frequency, for the circuit block based on the first and second health indicators. The separate n-type and p-type sensors may enable the health monitor circuit to separately assess the health of n-type and p-type transistors of the circuit block, and adjust one or more operating parameters accordingly. For example, the control circuit may separately adjust the guardband voltage for different portions of the circuit block (e.g., based on whether the portion is primarily n-type transistors or primarily p-type transistors.

In embodiments, the n-type sensor may include one or more inverters that are switchable between a stress mode and a measure mode. The individual inverters may include an n-type transistor that is to operate as a pull-down transistor for the inverter (e.g., that is coupled in the toggle/signal path of the inverter) in the stress mode and the measure mode. The inverter may further include a first p-type transistor that is to selectively operate as a first pull-up transistor for the inverter in the stress mode, and a second p-type transistor that is to selectively operate as a second pull-up transistor for the inverter in the measure mode. During the stress mode, the inverter may be operated, thereby aging (e.g., stressing and/or deteriorating) the n-type transistor. The aging of the n-type transistor may serve as a replica to correspond to aging of the other n-type transistors of the circuit block (e.g., in logic and/or memory circuits of the circuit block). The second p-type transistor may be off and/or otherwise substantially unstressed during the stress mode, and thus may not be substantially aged. During the measure mode, the inverter may again be operated, and any slow down in signal propagation through the inverter may be attributed to aging of the n-type transistor. Accordingly, the performance of the inverter during the measure mode may be used to determine the health of n-type transistors of the circuit block.

In embodiments, the p-type sensor may also include one or more inverters that are switchable between a stress mode and a measure mode. The individual inverters of the p-type sensor may include a p-type transistor that is to operate as a pull-up transistor for the inverter (e.g., that is coupled in the toggle/signal path of the inverter) in the stress mode and the measure mode. The p-type transistor may be used as the device under test to determine the health of p-type transistors of the circuit block. The inverter may further include a first n-type transistor that is to selectively operate as a first pull-down transistor for the inverter in the stress mode, and a second n-type transistor that is to selectively operate as a second pull-down transistor for the inverter in the measure mode. During the stress mode, the inverter may be operated, thereby aging (e.g., stressing and/or deteriorating) the p-type transistor (and the first n-type transistor). The aging of the p-type transistor may serve as a replica to correspond to aging of the other p-type transistors of the circuit block (e.g., in logic and/or memory circuits of the circuit block). The second n-type transistor may be off and/or otherwise substantially unstressed during the stress mode, and thus may not be substantially aged. During the measure mode, the inverter may again be operated, and any slow down in signal propagation through the inverter may be attributed to aging of the p-type transistor. Accordingly, the performance of the inverter during the measure mode may be used to determine the health of p-type transistors of the circuit block.

The inverters of the n-type and/or p-type sensor circuits may be arranged in any suitable configuration to enable measurement of the performance of the inverters during the measure mode. For example, in some embodiments, the inverters may be arranged in a ring oscillator, and the sensor circuit may determine the frequency of oscillation of the ring oscillator (e.g., based on a counter) to determine the health indicator associated with the respective n-type or p-type transistors. Other embodiments may use another suitable configuration of the inverters.

Additionally, or alternatively, while the sensor circuits are described herein with respect to inverters, other embodiments may use another suitable circuit structure in which performance degradation may be attributed predominantly to the respective n-type or p-type transistors (e.g., with one or more stress-mode transistors of the opposite type (e.g., p-type for an n-type sensor and n-type for a p-type sensor) that are in the signal path during the stress mode and decoupled from the signal path during the measure mode, and one or more measure-mode transistors of the opposite type that are decoupled from the signal path during the stress mode and coupled with the signal path in the measure mode).

Accordingly, the health monitor circuit described herein may provide on-die determination of the health of n-type and p-type transistors, enabling ongoing monitoring of device health. Additionally, the health monitor circuit may adjust the operating parameters based on the measured device health, which may improve the lifetime, reliability, and/or performance of the circuit. For example, when the transistors are determined to be relatively healthy (e.g., when the circuit is new), the circuit block may be operated at relatively low voltage and/or high clock frequency, thereby improving performance and/or providing lower power consumption. As the transistors age, the voltage may be increased and/or the clock frequency may be decreased to compensate for deterioration in the performance of the transistors. Additionally, the separate n-type and p-type sensors of the health monitor circuit may enable separate determination of the health of the n-type and p-type transistors, as well as separate adjustments based on the respective health information.

Furthermore, the health monitor circuit may include sensors associated with a plurality of circuit blocks (e.g., processor cores or another suitable circuit block) of an integrated circuit. Accordingly, the health determination and adjustment may be made separately for each circuit block. Additionally, in some embodiments, a circuit block may be disabled (e.g., not used) if the associated health indicator indicates that the circuit block is no longer functioning sufficiently (e.g., the health indicator is below a threshold and/or the health indicator has an invalid result that indicates that the circuit block is no longer functioning). Additionally, or alternatively, the health monitor circuit may prevent power-on or use of the device that employs the integrated circuit under some defined health conditions (e.g., the health of one or more circuit blocks, such as a circuit block that is deemed critical for device operation, is under a threshold or indicates that the circuit block is not functioning).

The health monitor circuit may be used in any suitable electronic device, as further discussed below, but may be particularly useful for devices in which reliability is particularly important, such as automobiles (e.g., autonomous driving automobiles), medical devices, and/or internet-of-things (IoT) devices.

FIG. 1 illustrates a health monitor circuit 100 to monitor and/or correct for reliability of a circuit block 102 (e.g., processor). The health monitor circuit 100 may include an n-type sensor 104 to determine health of n-type transistors of the circuit block 102, and a p-type sensor 106 to determine health of p-type transistors of the circuit block 102. The n-type sensor 104 and p-type sensor 106 may be on the same die as the circuit block 102. For example, the n-type sensor 104 and p-type sensor 106 may be included in the circuit block 102, as shown in FIG. 1.

The health monitor circuit 100 may further include a control circuit 108 coupled to the n-type sensor 104 and the p-type sensor 106. The health monitor circuit 100 may or may not be on the same die as the circuit block 102. In some embodiments, the control circuit 108 may be coupled to a plurality of n-type sensors 104 and/or p-type sensors 106 that are associated with different respective circuit blocks (e.g., on the same die or different dies).

In some embodiments, the n-type transistors that are monitored by the n-type sensor 104 may include n-type metal-oxide-semiconductor (NMOS) transistors, and the p-type transistors that are monitored by the p-type sensor 106 may be p-type metal-oxide-semiconductor (PMOS) transistors. Other embodiments may monitor the health of another suitable type of transistor in addition to or instead of NMOS and/or PMOS transistors.

The separate n-type sensor 104 and p-type sensor 106 enables the control circuit 108 to determine the health of p-type transistors and n-type transistors separately. The control circuit 108 may determine one or more health indicators for p-type transistors and n-type transistors of the circuit block 102 using the n-type sensor 104 and p-type sensor 106. The one or more health indicators may be based on, for example, switching/charging speed of the transistors. For example, the n-type sensor 104 and/or p-type sensor 106 may include a ring oscillator that utilizes aged transistors of the associated n-type or p-type, respectively, and the health indicator may include the frequency of oscillation of the ring oscillator (e.g., as determined by a counter), as further discussed below. The control circuit 108 may take corrective action for the circuit block 102 based on the determined health indicator(s) and/or a change in the health indicator(s) over time.

For example, the control circuit 108 may include a history table 110 to store past values of the one or more health indicators determined by the n-type sensor 104 and p-type sensor 106. The control circuit 108 may further include a comparator 112 to compare the current value of the one or more health indicators with one or more prior values. In some embodiments, the comparator 112 may determine a trend of the health of the n-type transistors and/or p-type sensors based on the current value and multiple prior values of the one or more health indicators. This information may be used, for example, to determine the amount of degradation in performance compared with initial or prior performance, and/or to estimate remaining lifetime of the circuit block 102.

The control circuit 108 may further include a controller 114 to take corrective action based on the determined health of the NMOS transistors and/or PMOS transistors of the circuit block 102 (e.g., based on the value of the one or more health indicators and/or based on the comparison of the present value with one or more prior values). The corrective action may include, for example, adjusting one or more operating parameters, e.g., voltage and/or frequency, of the circuit block 102.

For example, the circuit 100 may include a voltage regulator 116 (e.g., low dropout regulator (LDO)) to provide a regulated supply voltage to the circuit block 102 with a voltage level controlled by the controller 114 based on the determined health of the circuit block 102. The circuit 100 may further include a clock generator 118 (e.g., phase-locked loop (PLL)) to generate a clock signal for the circuit block 102. The frequency of the clock signal may be adjusted based on the determined health of the circuit block 102. For example, as the health of the circuit block 102 degrades, the voltage of the regulated supply voltage may be increased, and/or the frequency of the clock signal may be reduced.

In some embodiments, the controller 114 may determine different corrective actions to take when it is determined that the health of n-type transistors has deteriorated than when it is determined that the health of p-type transistors has deteriorated. For example, the performance of some circuits may be primarily impacted by aging of n-type transistors (e.g., input-output (TO) circuits (such as high-speed IO circuits), amplifier circuits (such as low-noise amplifier circuits), voltage regulators, etc.). Additionally, the performance of some circuits may be primarily impacted by aging of p-type transistors (e.g., processor cores, digital logic gates, static random access memory (SRAM) circuits, etc.). In some embodiments, one or more operating parameters (e.g., voltage and/or frequency) of different circuits may be adjusted based on whether performance of the circuit is primarily impacted by aging of n-type or p-type transistors. For example, in some embodiments, the circuit block 102 may include multiple circuit portions that are individually controllable based on the health information from the same sensor circuits 104 and 106. Additionally, or alternatively, the health monitor circuit 100 may include separate n-type sensors 104 and/or p-type sensors 106 in different circuit blocks 102 to enable separate determination of the health of the type of transistor (e.g., n-type or p-type) that primarily impacts performance of the associated circuit block 102.

In some embodiments, the controller 114 may disable the circuit block 102 (e.g., in a multi-core processor or a multi-block memory circuit) if the determined health of the transistors of the circuit block (e.g., n-type and/or p-type) is below a threshold or otherwise indicates that the circuit block is inoperable. Additionally, or alternatively, the controller 114 may prevent power-on or use of the device that employs the circuit block if the determined health is below a threshold or otherwise indicates that the circuit block is inoperable. Furthermore, in some embodiments, the controller 114 may initiate an alert to a user of the device (e.g., via a display, a sound, an indicator light, etc.) under certain health conditions. In some embodiments, the alert may indicate to the user that a circuit of the device is near failure (or has failed) and should be replaced. In some embodiments, the history table 110 may be used to estimate a remaining lifetime of the circuit block 102, and the remaining lifetime may be provided to the user.

Figure 2:
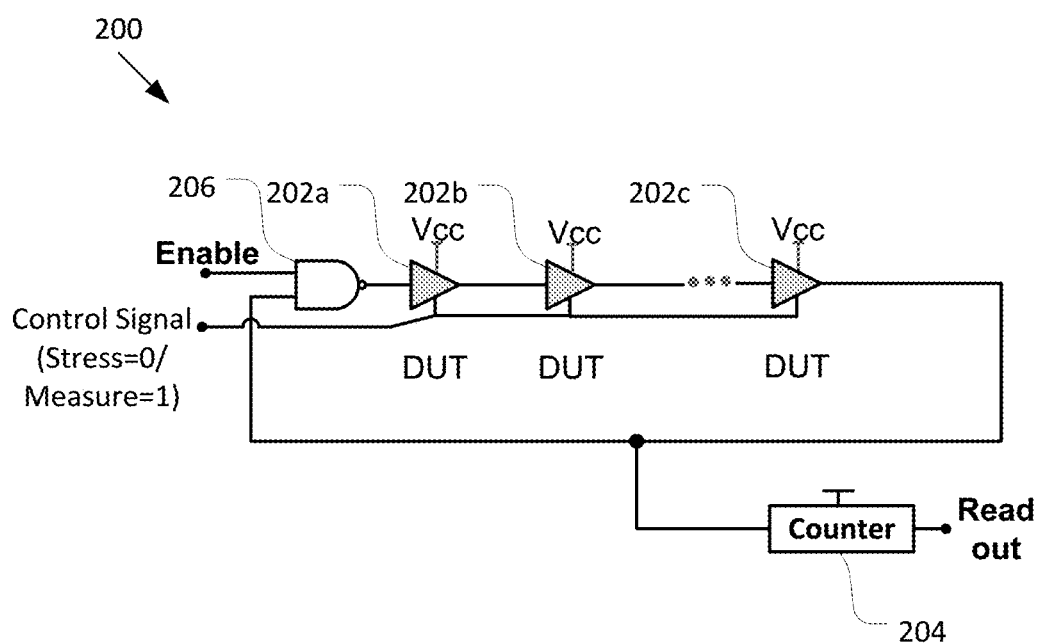
FIG. 2 illustrates a sensor circuit to determine a health indicator of n-type or p-type transistors of a circuit block, in accordance with various embodiments.

FIG. 2 illustrates an example sensor circuit 200 in accordance with various embodiments. The sensor circuit 200 may correspond to the n-type sensor 104 or the p-type sensor 106. The sensor circuit 200 may include a plurality of inverters 202*a*-*c* arranged in a feedback loop to form a ring oscillator. The ring oscillator of the sensor circuit 200 may include any suitable number (e.g., an odd number) of inverters 202*a*-*c*, such as 3 or more inverters (e.g., 3, 5, 7, etc.). The individual inverters 202*a*-*c* may receive a control signal (e.g., from the controller 114 or another suitable component of the control circuit 108) to switch the inverters between a stress mode and a measure mode. During the stress mode, the inverters 202*a*-*c* may operate to age the transistors in the toggle path of the inverter 202*a*-*c* (e.g., the path of the oscillating signal between the input and output terminals of the inverter). During the measure mode, the inverters 202*a*-*c* may operate in a manner so that frequency shift (e.g., due to aging) is based on the aging of only the transistors of the given type (e.g., n-type transistors for the n-type sensor circuit and p-type transistors for the p-type sensor circuit) and not the transistors of the other type.

Figure 3:
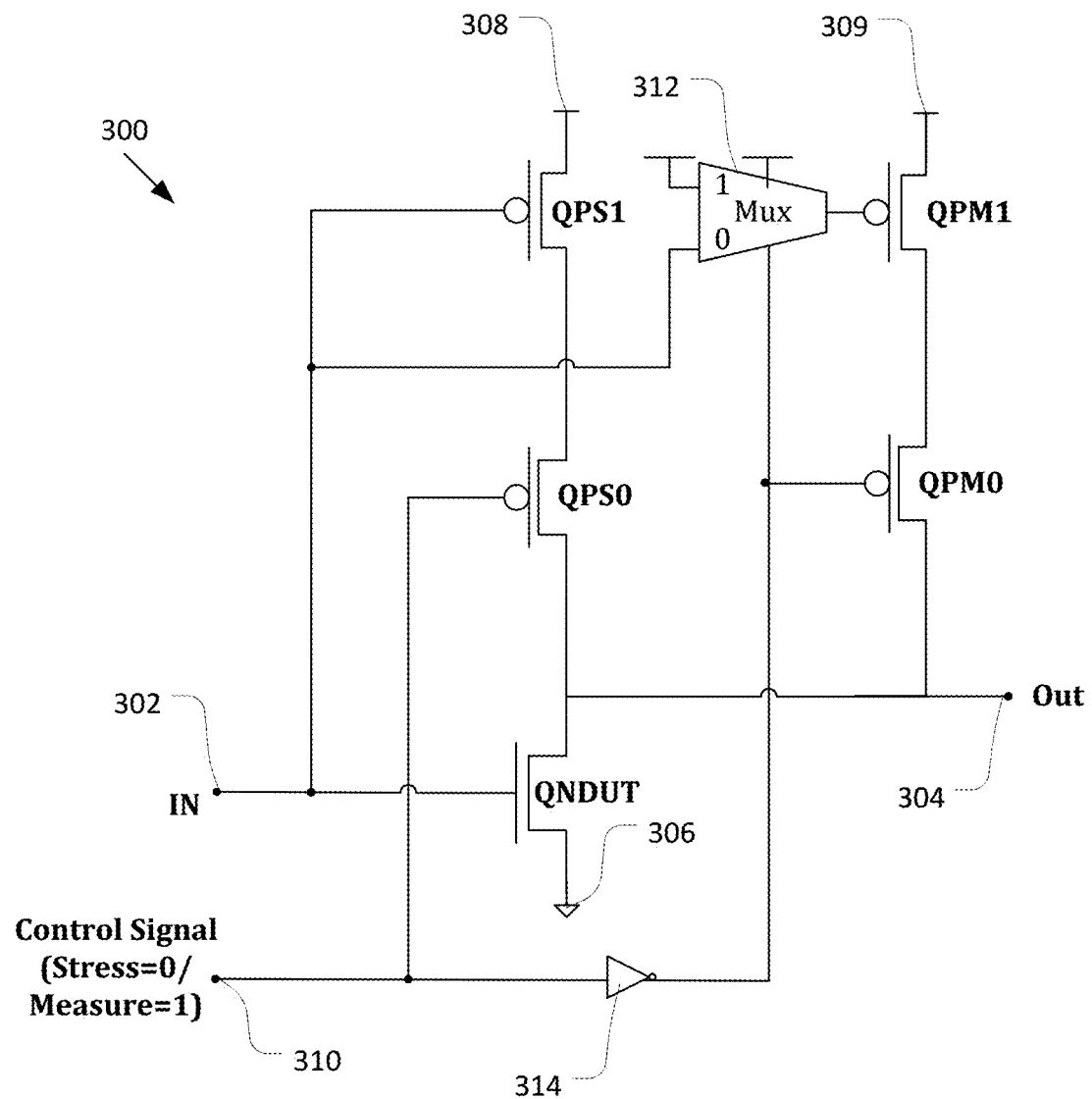
FIG. 3 illustrates an example inverter for an n-type sensor circuit, in accordance with various embodiments.

For example, FIG. 3 illustrates an inverter 300 for an n-type sensor circuit, in accordance with various embodiments. The inverter 300 may be included in the n-type sensor 104 and/or the sensor circuit 200. For example, the inverter 300 may correspond to the inverters 202a-c of sensor circuit 200. The inverter 300 may receive an input signal at an input terminal 302 and provide an output signal at an output terminal 304 that is an inverted version of the input signal. The inverter 300 may include an n-type transistor QNDUT that is coupled in the toggle path of the inverter 300 (e.g., as the pull-down transistor) during both the stress mode and the measure mode. The n-type transistor QNDUT is the "device under test" (DUT) used to determine the health of n-type transistors of the circuit block (e.g., in combination with the QNDUT's of the other inverters in the ring oscillator). A gate terminal of the QNDUT is coupled with the input terminal 302 of the inverter 300 to receive the input signal, and a drain of the QNDUT is coupled with the output terminal 304 of the inverter 300. A source of the QNDUT may be coupled to a ground terminal 306.

The inverter 300 may further include a first p-type pull-up transistor QPS1 and a control transistor QPS0 coupled in series between the output terminal 304 and a supply rail 308 that receives a supply voltage (e.g., VCC or another suitable voltage). The gate terminal of QPS1 may be coupled to the input terminal 302 to receive the input signal. The gate terminal of QPS0 may be coupled to a control terminal 310 to receive a control signal that switches the inverter 300 between the stress mode and the measure mode. The p-type transistor QPS1 may form an inverter with n-type transistor QNDUT during the stress mode (with QPS1 as the pull-up transistor and QNDUT as the pull-down transistor), but may be decoupled from the toggle path (e.g., by the control transistor QPS0) during the measure mode, as further discussed below.

The inverter 300 may further include a second p-type pull-up transistor QPM1 coupled between the output terminal 304 and a supply rail 309. In some embodiments, a control transistor QPM0 may be coupled in series with the transistor QPM1 between the output terminal 304 and the supply rail 309 (e.g., between the transistor QPM1 and the output terminal 304). The supply rail 309 may receive the same supply voltage (e.g., may be the same supply rail) as the supply rail 308. Alternatively, the supply rail 309 may receive another suitable supply voltage, such as a lower supply voltage than the supply voltage of supply rail 308.

In various embodiments, the gate terminal of the transistor QPM1 may be coupled to the output terminal of a multiplexer 312. A first input of the multiplexer 312 may be coupled to the input terminal 302 to receive the input signal, and the second input of the multiplexer 312 may receive a logic 1 voltage. The control terminal of the multiplexer may receive the control signal (e.g., an inverted version of the control signal via an inverter 314) to pass a selected one of the inputs to the gate terminal of the transistor QPM1 based on whether the inverter 300 is in the stress mode or the measure mode. The gate terminal of control transistor QPM0 may also be coupled to receive an inverted version of the control signal via inverter 314. In other embodiments, control transistor QPM0 may be replaced with an n-type transistor and may receive a non-inverted version of the control signal.

The pull-up transistor QPM1 may be decoupled from the toggle path (e.g., by QPM0) during the stress mode, and may be coupled to the toggle path during the measure mode to form an inverter with the n-type transistor QNDUT. Accordingly, the p-type transistor QPM1 may not be stressed during the stress mode, and thus may not exhibit degradation due to stress/aging.

In the stress mode, the control signal may be logic 0, thereby turning on the control transistor QPS0, which conductively couples the p-type transistor QPS1 to the output terminal 304. Accordingly, the p-type transistor QPS1 forms an inverter with the n-type transistor QNDUT, with QPS1 acting as the pull-up transistor and QNDUT acting as the pull-down transistor. Both QNDUT and QPS1 will alternately switch on and off based on the input signal to form an oscillating feedback signal. Thus, QNDUT and QPS1 will be stressed and will degrade over time. The degradation of QNDUT may be representative of the degradation of other n-type transistors of the associated circuit block.

Additionally, during the stress mode, the multiplexer 312 may pass the logic 1 to QPM1 and QPM0 will receive the inverted version of the control signal (e.g., logic 1). Accordingly, both p-type transistors QPM0 and QPM1 will be off throughout the stress mode, thereby preventing QPM0 and QPM1 from being stressed/aged.

In the measure mode, the control signal may be logic 1. Accordingly, control transistor QPS0 may be off, thereby decoupling p-type transistor QPS1 from the toggle path. Additionally, the multiplexer 312 will pass the input signal to the gate terminal of p-type transistor QPM1, and QPM0 will be on to couple QPM1 on the toggle path between the input terminal 302 and the output terminal 304. Accordingly, the p-type transistor QPM1 forms an inverter with the n-type transistor QNDUT, with QPM1 acting as the pull-up transistor and QNDUT acting as the pull-down transistor. QPM1 may be substantially unaged since it is decoupled from the toggle path during the stress mode, so any additional propagation delay of the inverter 300 may be attributed to the n-type transistor QNDUT.

Referring again to FIG. 2, the health of the n-type transistors in the circuit block may be determined based on the frequency of oscillation of the ring oscillator. In some embodiments, the health of the n-type transistors may also be determined based on the supply voltage supplied to the inverters 202a-c (e.g., at supply rail 308 in inverter 300), since the supply voltage may impact performance of the inverters 202a-c. The frequency of oscillation may be lower as the n-type transistors under test (QNDUTs) of the respective inverters 202a-c age. The frequency of oscillation may be determined, for example, by a counter 204 coupled to the ring oscillator that counts transitions in the oscillating signal (e.g., rising edges, falling edges, or both rising and falling edges). The sensor circuit 200 may be placed in the measure mode (e.g., by the control circuit 108 of circuit 100) for a predefined period of time. Accordingly, the counter value of counter 204 may provide a digital health indicator that corresponds to the health of the n-type transistors of the associated circuit block, with a higher number corresponding to better health.

In some embodiments, the sensor circuit 200 may further include enable logic 206 (e.g., a NAND gate) to enable the oscillation of the ring oscillator responsive to an enable signal. For example, the ring oscillator may be disabled when the sensor circuit 200 is powered up and then enabled after power up, e.g., to facilitate stable oscillation. The enable signal may also be used to control the switching activity of the transistors under test of the inverters 202a-c to be similar to the activity of other transistors of the same type (e.g., n-type or p-type) in the circuit block, so that aging of the transistors under test in the inverters 202a-c is similar to the aging of the other transistors of the same type. For example, the control circuit 108 (e.g., controller 114) may control the enable signal based on logic signals in the circuit block associated with the sensor circuit 200. The sensor circuit 200 may additionally or alternatively be powered down or placed in a low power state when the associated circuit block is powered down or placed in the low power state.

Figure 4:
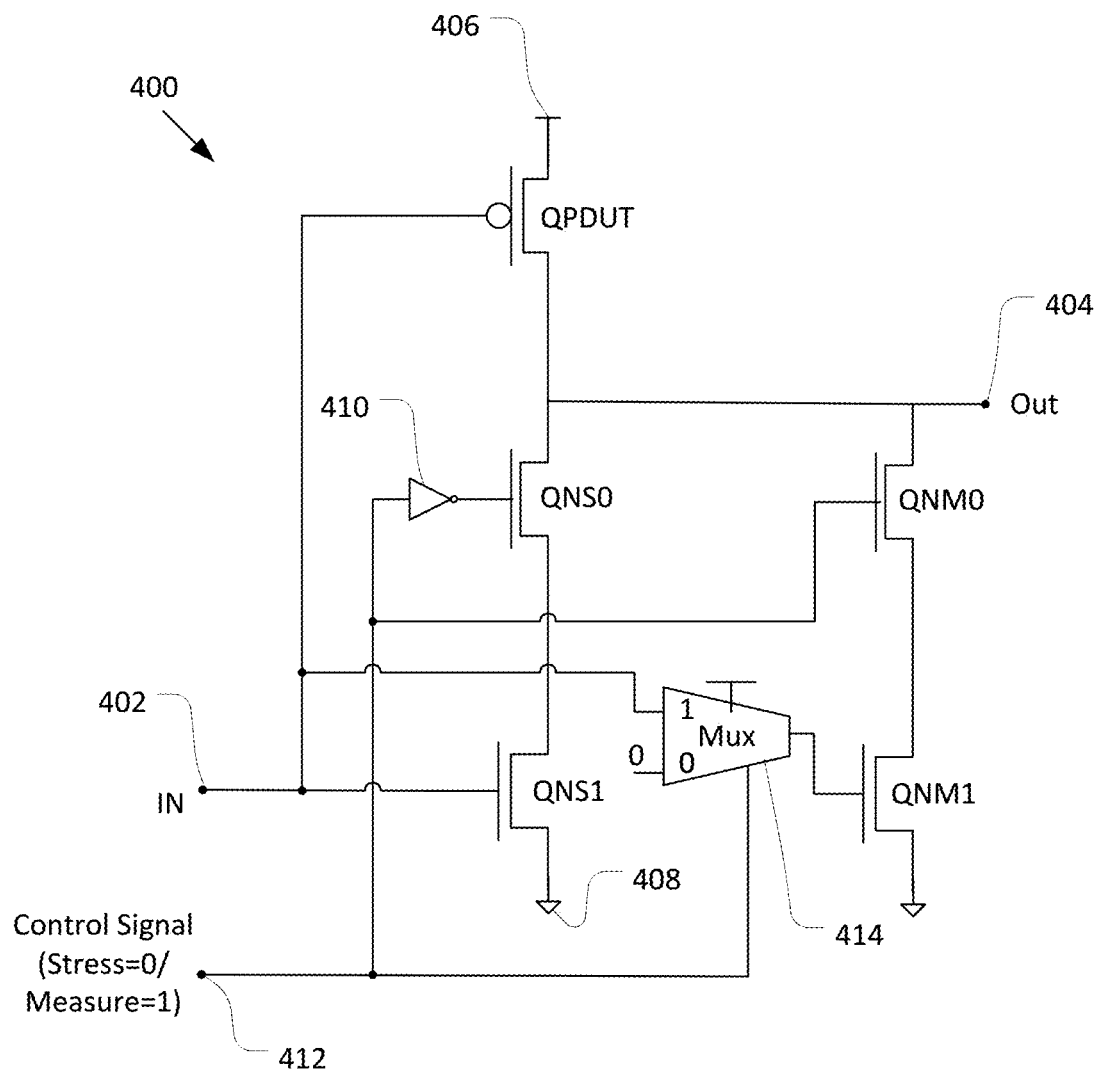
FIG. 4 illustrates an example inverter for a p-type sensor circuit, in accordance with various embodiments.

FIG. 4 illustrates an inverter 400 for a p-type sensor circuit, in accordance with various embodiments. The inverter 400 may be included in the p-type sensor 106 and/or the sensor circuit 200. For example, the inverter 400 may correspond to the inverters 202a-c of sensor circuit 200. The inverter 400 may receive an input signal at an input terminal 402 and provide an output signal at an output terminal 404 that is an inverted version of the input signal. The inverter 400 may include a p-type transistor QPDUT that is coupled in the toggle path of the inverter 400 (e.g., as the pull-up transistor) during both the stress mode and the measure mode. The p-type transistor QPDUT is the device under test used to determine the health of p-type transistors of the circuit block (e.g., in combination with the QPDUT's of the other inverters in the ring oscillator). A gate terminal of the QPDUT is coupled with the input terminal 402 of the inverter 400 to receive the input signal, and a drain of the QPDUT is coupled with the output terminal 404 of the inverter 400. A source of the QPDUT may be coupled to a power supply rail 406.

The inverter 400 may further include a stress-mode pull-down transistor QNS1, with a control transistor QNS0 coupled between QNS1 and the output terminal 404. The stress-mode pull-down transistor QNS1 may be an n-type transistor, with the gate terminal coupled to the input terminal 402 to receive the input signal, and the source terminal coupled to a ground terminal 408. The transistor QNS0 may selectively conductively couple QNS1 (e.g., the drain terminal of QNS1) to the output terminal 404 during the stress mode responsive to the control signal. For example, QNS0 may be an n-type transistor, as shown in FIG. 4, and may receive an inverted version of the control signal at its gate terminal (e.g., via an inverter 410 coupled between the control terminal 412 and the gate terminal of QNS0). Alternatively, QNS0 may be replaced with a p-type transistor and may receive the control signal at its gate terminal. Accordingly, during the stress mode, QNS1 may be on, and QPDUT and QNS1 may form an inverter to provide the output signal at the output terminal 404 based on the input signal at the input terminal 402. During the measure mode, transistor QNS0 may be off, thereby decoupling transistor QNS1 from the output terminal 404.

The inverter 400 may further include a measure-mode pull-down transistor QNM1, which may be an n-type transistor. A gate terminal of the transistor QNM1 may be coupled to the output of a multiplexer 414. A first input of the multiplexer 414 may be coupled to the input terminal 402 to receive the input signal. A second input of the multiplexer may be coupled to a logic 0 voltage. The control terminal of the multiplexer 414 may receive the control signal, so that the multiplexer 414 passes the input signal to the transistor QNM1 in the measure mode and passes the logic 0 voltage to the transistor QNM1 in the stress mode.

The inverter 400 may further include a transistor QNM0 may be coupled between the measure-mode pull-down transistor QNM1 (e.g., the drain terminal of QNM) and the output terminal 404. The transistor QNM0 may selectively conductively couple QNM1 (e.g., the drain terminal of QNM) to the output terminal 404 during the measure mode responsive to the control signal. For example, QNM0 may be an n-type transistor, as shown in FIG. 4, and may receive the control signal at its gate terminal. Alternatively, QNM0 may be replaced with a p-type transistor and may receive an inverted version of the control signal at its gate terminal. Accordingly, during the stress mode, transistor QNM0 may be off, thereby decoupling the measure-mode pull-down transistor QNM1 from the output terminal 404. Additionally, the multiplexer 414 may pass the logic 0 voltage to the transistor QNM1 in the stress mode, so QNM1 along with QNM0 may be off and not stressed. During the measure mode, QPDUT and QNM1 may form an inverter to provide the output signal at the output terminal 404 based on the input signal at the input terminal 402. Measure-mode pull-down transistor may be substantially unaged since it is decoupled from the toggle path during the stress mode, so any additional propagation delay of the inverter 400 during the measure mode may be attributed to the p-type transistor QPDUT.

Figure 5:
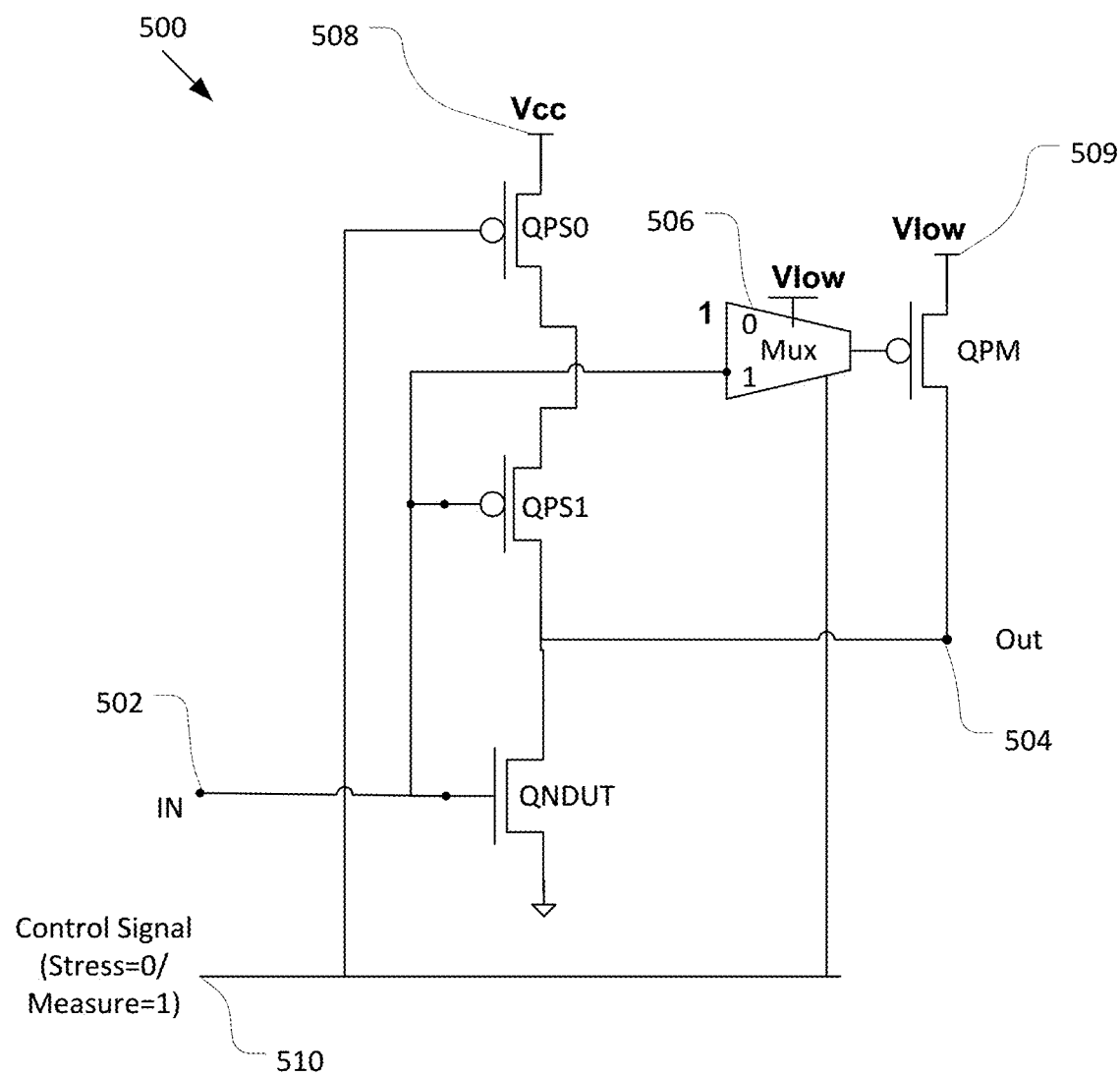
FIG. 5 illustrates another example inverter for an n-type sensor circuit, in accordance with various embodiments.

FIG. 5 illustrates another example inverter 500 for an n-type sensor circuit (e.g., n-type sensor 104 and/or sensor circuit 200), in accordance with various embodiments. The inverter 500 may include a measure-mode pull-up transistor QPM that is directly coupled to the output terminal 504 (e.g., there is no control transistor coupled between the pull-up transistor QPM and the output terminal 504). The measure-mode pull-up transistor QPM may be off during the stress mode and may receive the input signal during the measure mode. For example, the output of a multiplexer 506 may be coupled to the gate terminal of the measure-mode pull-up transistor QPM. The multiplexer 506 may be responsive to the control signal to pass a logic 1 to the pull-up transistor QPM during the stress mode (to turn off QPM) and to pass the input signal to the gate terminal of QPM during the measure mode. Accordingly, QPM may selectively operate as the pull-up transistor of the inverter 500 during the measure mode.

The inverter 500 may further include an n-type pull-down transistor QNDUT (the device under test), a stress-mode pull-up transistor QPS1 and a control transistor QPS0. The control transistor QPS0 may be coupled between the stress-mode pull-up transistor QPS1 and a supply rail 508, as shown. Alternatively, the control transistor QPS0 may be coupled between the stress-mode pull-up transistor QPS1 and the output terminal 504, similar to the arrangement shown in FIG. 3. The input terminal 502 may be coupled to the gate terminal of the n-type pull-down transistor QNDUT, the gate terminal of the stress-mode pull-up transistor QPS1, and/or an input terminal of the multiplexer 506. The control terminal 510 may be coupled to the gate terminal of the control transistor QPS0 and the control terminal of the multiplexer 506.

During the stress mode, control transistor QPS0 may be on to provide the supply voltage from supply rail 508 to the source terminal of the stress-mode pull-up transistor QPS1. Accordingly, pull-up transistor QPS1 and pull-down transistor QNDUT may form an inverter between the input terminal 502 and the output terminal 504. Measure-mode pull-up transistor QPM may be off, as discussed above.

During the measure mode, control transistor QPS0 may be off, thereby placing the stress-mode pull-up transistor QPS1 in the Z-state. The measure-mode pull-up transistor QPM may receive the input signal from the input terminal 502, and may form an inverter with the pull-down transistor QNDUT.

In some embodiments, a source terminal of the measure-mode pull-up transistor QPM may be coupled to a supply rail 509 that receives a lower supply voltage (Vlow) than a supply voltage (Vcc) that is provided to the stress-mode pull-up transistor QPS1 (e.g., via supply rail 508). The lower supply voltage provided to the measure-mode pull-up transistor QPM may reduce the stress/aging on transistor QPM, thereby enabling the inverter to exhibit aging/slowdown that is predominantly based on the aging of transistor QNDUT. In some embodiments, the multiplexer 506 may also be powered by the lower supply voltage Vlow.

It will be apparent that inverters 300 and 500 are merely examples of an inverter that may be used for an n-type sensor, in accordance with various embodiments. Other embodiments may combine and/or modify features of the inverters 300 and/or 500.

Figure 6:
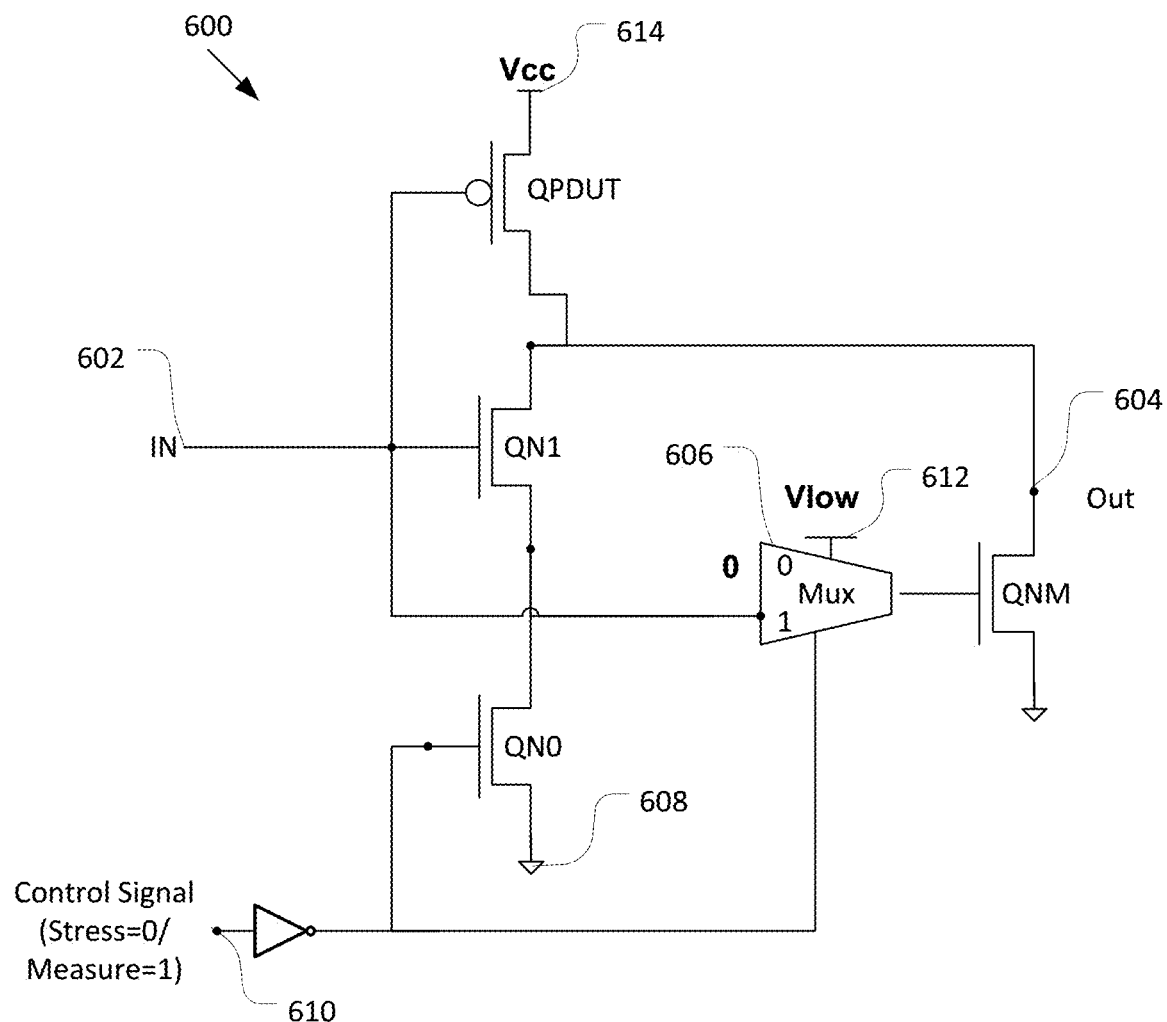
FIG. 6 illustrates another example inverter for a p-type sensor circuit, in accordance with various embodiments.

FIG. 6 illustrates another example inverter 600 for a p-type sensor circuit (e.g., p-type sensor 106 and/or sensor circuit 200), in accordance with various embodiments. The inverter 600 may receive an input signal at an input terminal 602 and pass an output signal at an output terminal 604 that is an inverted version of the input signal. The circuit 600 may include a measure-mode pull-down transistor QNM that is directly coupled to the output terminal 604 (e.g., there is no control transistor coupled between the pull-down transistor QNM and the output terminal 604). The measure-mode pull-down transistor QNM may be off during the stress mode and may receive the input signal during the measure mode. For example, the output of a multiplexer 606 may be coupled to the gate terminal of the measure-mode pull-down transistor QNM. The multiplexer 606 may be responsive to the control signal to pass a logic 0 to the pull-down transistor QNM during the stress mode (to turn off QNM) and to pass the input signal to the gate terminal of QNM during the measure mode. Accordingly, QNM may selectively operate as the pull-down transistor of the inverter 600 during the measure mode.

The inverter 600 may further include a p-type pull-up transistor QPDUT (the device under test), a stress-mode pull-down transistor QN1 and a control transistor QN0. The control transistor QN0 may be coupled between the stress-mode pull-down transistor QN1 and a ground terminal 608, as shown. Alternatively, the control transistor QN0 may be coupled between the stress-mode pull-down transistor QN1 and the output terminal 604, similar to the arrangement shown in FIG. 4. The input terminal 602 may be coupled to the gate terminal of the p-type pull-up transistor QPDUT, the gate terminal of the stress-mode pull-down transistor QN1, and/or an input terminal of the multiplexer 606. The control terminal 610 may be coupled to the gate terminal of the control transistor QN0 and the control terminal of the multiplexer 606.

During the stress mode, control transistor QN0 may be on to conductively couple the source terminal of the stress-mode pull-down transistor QN1 to ground. Accordingly, pull-down transistor QN1 and pull-up transistor QPDUT may form an inverter between the input terminal 602 and the output terminal 604. Measure-mode pull-down transistor QNM may be off, as discussed above.

During the measure mode, control transistor QN0 may be off, thereby placing the stress-mode pull-down transistor QN1 in the Z-state. The measure-mode pull-down transistor QNM may receive the input signal from the input terminal 602, and may form an inverter with the pull-up transistor QPDUT.

In some embodiments, the multiplexer 606 may be coupled to a supply rail 612 that receives a lower supply voltage (Vlow) than a supply voltage (Vcc) that is provided to the pull-up transistor QPDUT (e.g., via supply rail 614). Alternatively, the multiplexer 606 may be powered by Vcc.

It will be apparent that inverters 400 and 600 are merely examples of an inverter that may be used for an n-type sensor, in accordance with various embodiments. Other embodiments may combine and/or modify features of the inverters 400 and/or 600.

Figure 7:
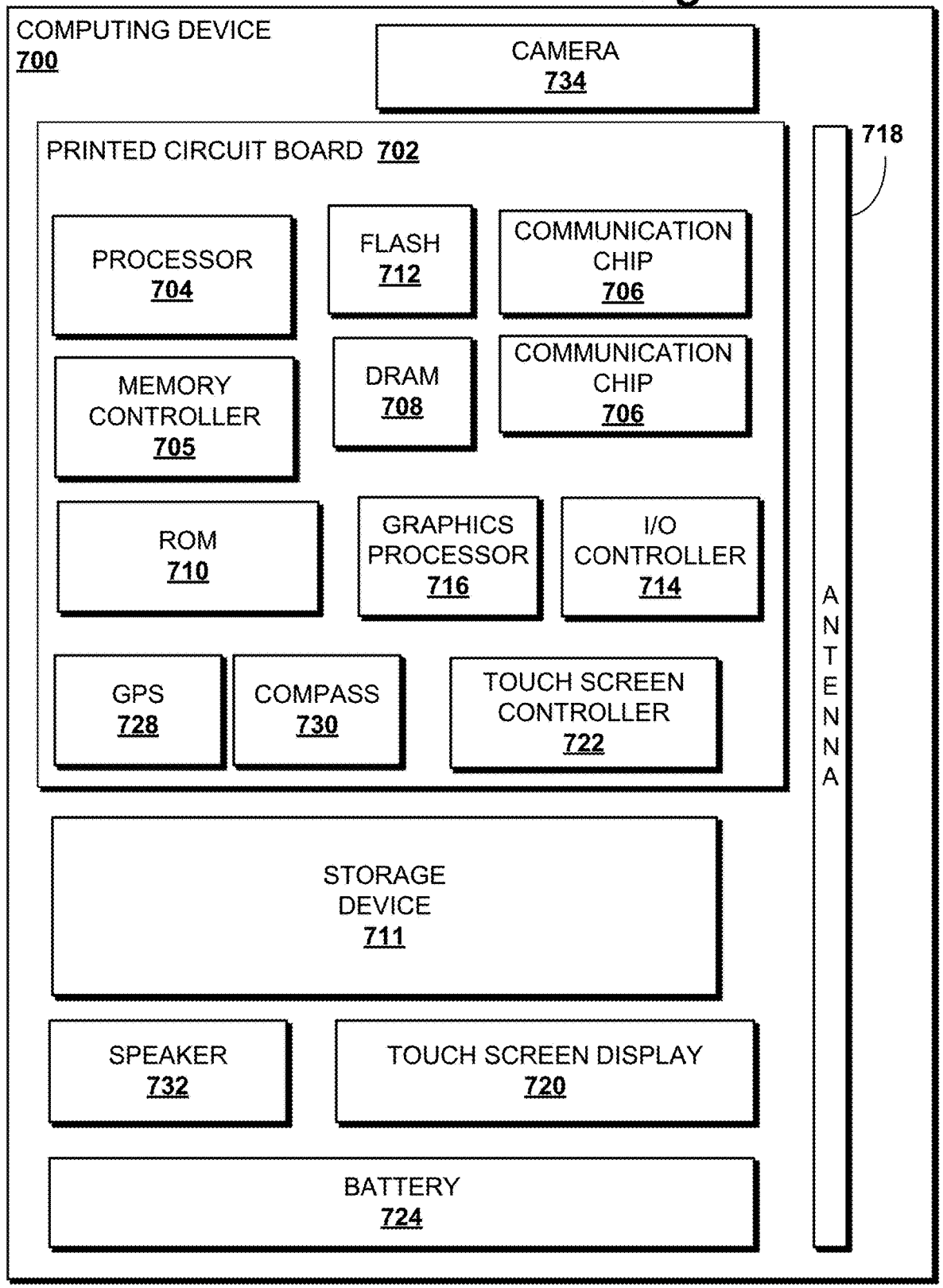
FIG. 7 illustrates an example system configured to employ the apparatuses and methods described herein, in accordance with various embodiments.

FIG. 7 illustrates an example computing device 700 that may employ the apparatuses and/or methods described herein (e.g., circuit 100, circuit 200, inverter 300, inverter 400, inverter 500, and/or inverter 600), in accordance with various embodiments. As shown, computing device 700 may include a number of components, such as one or more processor(s) 704 (one shown) and at least one communication chip 706. In various embodiments, the one or more processor(s) 704 each may include one or more processor cores. In various embodiments, the at least one communication chip 706 may be physically and electrically coupled to the one or more processor(s) 704. In further implementations, the communication chip 706 may be part of the one or more processor(s) 704. In various embodiments, computing device 700 may include printed circuit board (PCB) 702. For these embodiments, the one or more processor(s) 704 and communication chip 706 may be disposed thereon. In alternate embodiments, the various components may be coupled without the employment of PCB 702.

Depending on its applications, computing device 700 may include other components that may or may not be physically and electrically coupled to the PCB 702. These other components include, but are not limited to, memory controller 705, volatile memory (e.g., dynamic random access memory (DRAM) 708), non-volatile memory such as read only memory (ROM) 710, flash memory 712, storage device 711 (e.g., a hard-disk drive (HDD)), an I/O controller 714, a digital signal processor (not shown), a crypto processor (not shown), a graphics processor 716, one or more antenna 718, a display (not shown), a touch screen display 720, a touch screen controller 722, a battery 724, an audio codec (not shown), a video codec (not shown), a global positioning system (GPS) device 728, a compass 730, an accelerometer (not shown), a gyroscope (not shown), a speaker 732, a camera 734, and a mass storage device (such as hard disk drive, a solid state drive, compact disk (CD), digital versatile disk (DVD)) (not shown), and so forth. In various embodiments, the processor 704 may be integrated on the same die with other components to form a System on Chip (SoC).

In some embodiments, the one or more processor(s) 704, flash memory 712, and/or storage device 711 may include associated firmware (not shown) storing programming instructions configured to enable computing device 700, in response to execution of the programming instructions by one or more processor(s) 704, to practice all or selected aspects of the methods described herein. In various embodiments, these aspects may additionally or alternatively be implemented using hardware separate from the one or more processor(s) 704, flash memory 712, or storage device 711.

In various embodiments, one or more components of the computing device 700 may include the circuit 100, circuit 200, inverter 300, inverter 400, inverter 500, and/or inverter 600) described herein. For example, circuit 100, circuit 200, inverter 300, inverter 400, inverter 500, and/or inverter 600)

may be implemented in processor 704, communication chip 706, I/O controller 714, memory controller 705, and/or another component of computing device 700.

The communication chips 706 may enable wired and/or wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others.

In various implementations, the computing device 700 may be an automobile, a medical device, a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, a digital video recorder, an electronic sensor, a smart home device, an internet of things (IoT) device, etc. In further implementations, the computing device 700 may be any other electronic device that processes data.

Some non-limiting Examples of various embodiments are provided below.

Example 1 is a circuit comprising: a circuit block; an n-type sensor to determine a first health indicator that corresponds to a health of n-type transistors of the circuit block; and a p-type sensor to determine a second health indicator that corresponds to a health of p-type transistors of the circuit block.

Example 2 is the circuit of Example 1, wherein the n-type sensor includes an inverter that is switchable between a stress mode and a measure mode, wherein the inverter includes: an n-type transistor that is to operate as a pull-down transistor for the inverter in the stress mode and the measure mode; a first p-type transistor that is to selectively operate as a first pull-up transistor for the inverter in the stress mode; and a second p-type transistor that is to selectively operate as a second pull-up transistor for the inverter in the measure mode.

Example 3 is the circuit of Example 2, wherein the inverter further comprises a control transistor coupled between the first p-type transistor and an output terminal of the inverter to selectively couple the first p-type transistor to the output terminal during the stress mode.

Example 4 is the circuit of Example 3, wherein the control transistor is a first control transistor, and wherein the inverter further comprises a second control transistor coupled between the second p-type transistor and the output terminal to selectively couple the second p-type transistor to the output terminal during the measure mode.

Example 5 is the circuit of any of Examples 1-4, wherein the p-type sensor includes an inverter that is switchable between a stress mode and a measure mode, wherein the inverter includes: a p-type transistor that is to operate as a pull-up transistor for the inverter in the stress mode and the measure mode; a first n-type transistor that is to selectively operate as a first pull-down transistor for the inverter in the stress mode; and a second n-type transistor that is to selectively operate as a second pull-down transistor for the inverter in the measure mode.

Example 6 is the circuit of Example 5, wherein the inverter further comprises a control transistor coupled between the first n-type transistor and an output terminal of the inverter to selectively couple the first n-type transistor to the output terminal during the stress mode.

Example 7 is the circuit of Example 6, wherein the control transistor is a first control transistor, and wherein the inverter further comprises a second control transistor coupled between the second n-type transistor and the output terminal to selectively couple the second n-type transistor to the output terminal during the measure mode.

Example 8 is the circuit of any of Examples 1-7, wherein the n-type sensor includes a plurality of inverters arranged in a ring oscillator, wherein the inverters are to receive a control signal to switch the inverters between a stress mode and a measure mode.

Example 9 is the circuit of Example 8, wherein the n-type sensor further includes a counter to count oscillations of the ring oscillator, wherein the counted oscillations correspond to the first health indicator.

Example 10 is the circuit of Example 8 or 9, further comprising enable logic coupled to the ring oscillator to selectively enable oscillation of the ring oscillator.

Example 11 is the circuit of any of Examples 1-10, further comprising a control circuit to receive the first and second health indicators and to adjust one or both of an operating voltage or an operating frequency of the circuit block based on the first and second health indicators.

Example 12 is the circuit of Example 11, wherein the control circuit is further to adjust the operating voltage or the operating frequency based on a supply voltage of the n-type sensor or the p-type sensor.

Example 13 is the circuit of Example 11 or 12, wherein the control circuit is to compare the first and second health indicators to one or more prior values of the respective first and second health indicators, and wherein the control circuit is to adjust the operating voltage or the operating frequency of the circuit block based on the comparison.

Example 14 the circuit of any of Examples 11-13, wherein the control circuit is to separately adjust the operating voltage or operating frequency of different portions of the circuit block based on the first and second health indicators.

Example 15 is an n-type health sensor circuit comprising an inverter that is switchable between a stress mode and a measure mode, wherein the inverter includes: an n-type pull-down transistor having a gate terminal coupled to an input terminal to receive an input signal of the inverter, and a source terminal coupled to an output terminal of the inverter; a first pull-up transistor having a gate terminal coupled to the input terminal; a control transistor to selectively couple a drain terminal of the first pull-up transistor to the output terminal during the stress mode and decouple the drain terminal of the first pull-up transistor from the output terminal during the measure mode; and a second pull-up transistor to be off during the stress mode and to receive the input signal during the measure mode.

Example 16 is the n-type health sensor circuit of Example 15, wherein the control transistor is a first control transistor, and wherein the inverter further includes a second control transistor to selectively couple a drain terminal of the second pull-up transistor to the output terminal during the measure mode and to decouple the drain terminal of the first pull-up transistor from the output terminal during the stress mode.

Example 17 is the n-type health sensor circuit of Example 15 or 16, wherein a source terminal of the first pull-up transistor is coupled to a first supply rail to receive a first supply voltage, wherein a source terminal of the second pull-up transistor is coupled to a second supply rail to receive a second supply voltage, and wherein the second supply voltage is lower than the first supply voltage.

Example 18 is the n-type health sensor circuit of Example 15 or 17, wherein a drain terminal of the second pull-up transistor is directly coupled to the output terminal during the measure mode and the stress mode.

Example 19 is the n-type health sensor circuit of any of Examples 15-18, wherein the inverter is a first inverter, and wherein the n-type health sensor circuit comprises a plurality of inverters, including the first inverter, arranged in a ring oscillator.

Example 20 is a system comprising: a plurality of circuit blocks, wherein individual circuit blocks of the plurality of circuit blocks include: an n-type sensor to determine a first health indicator associated with n-type transistors of the circuit block; and a p-type sensor to determine a second health indicator associated with p-type transistors of the circuit block. The system further includes a control circuit coupled to the plurality of circuit blocks, wherein the control circuit is to adjust at least one of an operating voltage or an operating frequency of the respective circuit blocks based on the respective first and second health indicators.

Example 21 is the system of Example 20, wherein the control circuit is to separately adjust the operating voltage or the operating frequency of different portions of the respective circuit block based on the respective first and second health indicators.

Example 22 is the system of Example 20, wherein the n-type sensor includes an inverter that is switchable between a stress mode and a measure mode, wherein the inverter includes: an n-type pull-down transistor that is to be conductively coupled between an input terminal and an output terminal of the inverter during the stress mode and the measure mode; a first pull-up transistor to be selectively conductively coupled between the input terminal and the output terminal during the stress mode; and a second pull-up transistor to be selectively conductively coupled between the input terminal and the output terminal during the measure mode.

Example 23 is the system of Example 20, wherein the p-type sensor includes an inverter that is switchable between a stress mode and a measure mode, wherein the inverter includes: a p-type pull-up transistor that is to be conductively coupled between an input terminal and an output terminal of the inverter during the stress mode and the measure mode; a first pull-down transistor to be selectively conductively coupled between the input terminal and the output terminal during the stress mode; and a second pull-down transistor to be selectively conductively coupled between the input terminal and the output terminal during the measure mode.

Example 24 is the system of Example 20, wherein the plurality of circuit blocks are on a same integrated circuit die.

Example 25 is the system of Example 20, wherein the system is incorporated into an automobile.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
    a circuit block;
    an n-type sensor to determine a first health indicator that corresponds to a health of n-type transistors of the circuit block; and
    a p-type sensor to determine a second health indicator that corresponds to a health of p-type transistors of the circuit block, wherein the p-type sensor includes an inverter that is switchable between a stress mode and a measure mode, wherein the inverter includes:
        a p-type transistor that is to operate as a pull-up transistor for the inverter in the stress mode and the measure mode;
        a first n-type transistor that is to selectively operate as a first pull-down transistor for the inverter in the stress mode;
        a second n-type transistor that is to selectively operate as a second pull-down transistor for the inverter in the measure mode; and
        a control transistor coupled between the first n-type transistor and an output terminal of the inverter to selectively couple the first n-type transistor to the output terminal during the stress mode.

2. The circuit of claim 1, wherein the inverter is a first inverter, wherein the p-type transistor is a first p-type transistor, wherein the n-type sensor includes a second inverter that is switchable between a stress mode and a measure mode, and wherein the second inverter includes:
    a third n-type transistor that is to operate as a pull-down transistor for the inverter in the stress mode and the measure mode;
    a second p-type transistor that is to selectively operate as a first pull-up transistor for the inverter in the stress mode; and
    a third p-type transistor that is to selectively operate as a second pull-up transistor for the inverter in the measure mode.

3. The circuit of claim 2, wherein the control transistor is a first control transistor, wherein the second inverter further comprises a second control transistor coupled between the second p-type transistor and an output terminal of the second inverter to selectively couple the second p-type transistor to the output terminal of the second inverter during the stress mode.

4. The circuit of claim 3, wherein the inverter further comprises a third control transistor coupled between the third p-type transistor and the output terminal of the second inverter to selectively couple the third p-type transistor to the output terminal of the second inverter during the measure mode.

5. The circuit of claim 1, wherein the control transistor is a first control transistor, and wherein the inverter further comprises a second control transistor coupled between the second n-type transistor and the output terminal to selectively couple the second n-type transistor to the output terminal during the measure mode.

6. The circuit of claim 1, wherein the inverter is a first inverter, wherein the p-type sensor includes a plurality of inverters, including the first inverter, arranged in a ring oscillator, and wherein the inverters are to receive a control signal to switch the inverters between a stress mode and a measure mode.

7. The circuit of claim 6, wherein the p-type sensor further includes a counter to count oscillations of the ring oscillator, wherein the counted oscillations correspond to the first health indicator.

8. The circuit of claim 6, further comprising enable logic coupled to the ring oscillator to selectively enable oscillation of the ring oscillator.

9. The circuit of claim 1, further comprising a control circuit to receive the first and second health indicators and to adjust one or both of an operating voltage or an operating frequency of the circuit block based on the first and second health indicators.

10. The circuit of claim 9, wherein the control circuit is further to adjust the operating voltage or the operating frequency based on a supply voltage of the n-type sensor or the p-type sensor.

11. The circuit of claim 9, wherein the control circuit is to compare the first and second health indicators to one or more prior values of the respective first and second health indicators, and wherein the control circuit is to adjust the operating voltage or the operating frequency of the circuit block based on the comparison.

12. The circuit of claim 9, wherein the control circuit is to separately adjust the operating voltage or operating frequency of different portions of the circuit block based on the first and second health indicators.

13. An n-type health sensor circuit comprising an inverter that is switchable between a stress mode and a measure mode, wherein the inverter includes:
an n-type pull-down transistor having a gate terminal coupled to an input terminal to receive an input signal of the inverter, and a source terminal coupled to an output terminal of the inverter;
a first pull-up transistor having a gate terminal coupled to the input terminal;
a control transistor to selectively couple a drain terminal of the first pull-up transistor to the output terminal during the stress mode and decouple the drain terminal of the first pull-up transistor from the output terminal during the measure mode; and
a second pull-up transistor to be off during the stress mode and to receive the input signal during the measure mode.

14. The n-type health sensor circuit of claim 13, wherein the control transistor is a first control transistor, and wherein the inverter further includes a second control transistor to selectively couple a drain terminal of the second pull-up transistor to the output terminal during the measure mode and to decouple the drain terminal of the first pull-up transistor from the output terminal during the stress mode.

15. The n-type health sensor circuit of claim 13, wherein a source terminal of the first pull-up transistor is coupled to a first supply rail to receive a first supply voltage, wherein a source terminal of the second pull-up transistor is coupled to a second supply rail to receive a second supply voltage, and wherein the second supply voltage is lower than the first supply voltage.

16. The n-type health sensor circuit of claim 15, wherein a drain terminal of the second pull-up transistor is directly coupled to the output terminal during the measure mode and the stress mode.

17. The n-type health sensor circuit of claim 13, wherein the inverter is a first inverter, and wherein the n-type health sensor circuit comprises a plurality of inverters, including the first inverter, arranged in a ring oscillator.

18. A system comprising:
a plurality of circuit blocks, wherein individual circuit blocks of the plurality of circuit blocks include:
an n-type sensor to determine a first health indicator associated with n-type transistors of the circuit block, wherein the n-type sensor includes an inverter that is switchable between a stress mode and a measure mode, wherein the inverter includes:
an n-type pull-down transistor that is to be conductively coupled between an input terminal and an output terminal of the inverter during the stress mode and the measure mode;
a first pull-up transistor to be selectively conductively coupled between the input terminal and the output terminal during the stress mode;
a second pull-up transistor to be selectively conductively coupled between the input terminal and the output terminal during the measure mode; and
a control transistor coupled between the first pull-up transistor and the output terminal of the inverter to selectively couple the first pull-up transistor to the output terminal during the stress mode; and
a p-type sensor to determine a second health indicator associated with p-type transistors of the circuit block; and
a control circuit coupled to the plurality of circuit blocks, wherein the control circuit is to adjust at least one of an operating voltage or an operating frequency of the respective circuit blocks based on the respective first and second health indicators.

19. The system of claim 18, wherein the control circuit is to separately adjust the operating voltage or the operating frequency of different portions of the respective circuit block based on the respective first and second health indicators.

20. The system of claim 18, wherein the p-type sensor includes an inverter that is switchable between a stress mode and a measure mode, wherein the inverter includes:
a p-type pull-up transistor that is to be conductively coupled between an input terminal and an output terminal of the inverter during the stress mode and the measure mode;
a first pull-down transistor to be selectively conductively coupled between the input terminal and the output terminal during the stress mode; and
a second pull-down transistor to be selectively conductively coupled between the input terminal and the output terminal during the measure mode.

21. The system of claim 18, wherein the plurality of circuit blocks are on a same integrated circuit die.

22. The system of claim 18, wherein the system is incorporated into an automobile.

* * * * *